United States Patent [19]

Ogawa

[11] Patent Number: 5,574,757
[45] Date of Patent: Nov. 12, 1996

[54] PHASE-LOCKED LOOP CIRCUIT HAVING A TIMING HOLDOVER FUNCTION

[75] Inventor: Yoshito Ogawa, Tokyo, Japan

[73] Assignee: NEC Corporation, Tokyo, Japan

[21] Appl. No.: 494,564

[22] Filed: Jun. 22, 1995

[30] Foreign Application Priority Data

Jun. 22, 1994 [JP] Japan .................................. 6-139942

[51] Int. Cl.⁶ .................................................. H03D 3/24
[52] U.S. Cl. ........................ 375/376; 375/362; 327/156; 327/160
[58] Field of Search .......................... 375/371, 373–376, 375/372, 362; 327/156, 158, 160–163; 370/100.1, 105.3

[56] References Cited

U.S. PATENT DOCUMENTS

| 4,715,050 | 12/1987 | Tanaka et al. | ............................ 375/376 |
| 5,034,967 | 7/1991 | Cox et al. | ................................ 375/373 |
| 5,095,498 | 3/1992 | DeLuca et al. | ........................... 375/94 |

*Primary Examiner*—Stephen Chin
*Assistant Examiner*—Thuy L. Nguyen
*Attorney, Agent, or Firm*—Sughrue, Mion, Zinn, Macpeak & Seas

[57] ABSTRACT

A phase-locked loop circuit comprises a plurality of memory counters which generate respective timing clocks corresponding to phase components detected from an input clock signal at different time instants having a predetermined time interval. Of the timing clocks, a single timing clock is selected such that the timing clock selected corresponds to a phase component previous to the latest phase component of the input clock signal. When the input clock signal stops dead or a substantial departure of frequency or phase occurs therein, the timing clock selected is applied as a reference clock to a phase comparator of the PLL circuit instead of the input clock signal.

17 Claims, 9 Drawing Sheets

FIG. I (PRIOR ART)

OUTPUT CLOCK b
SIGNAL
RESET TIMING q
SIGNAL
DIVIDED CLOCK f
SIGNAL

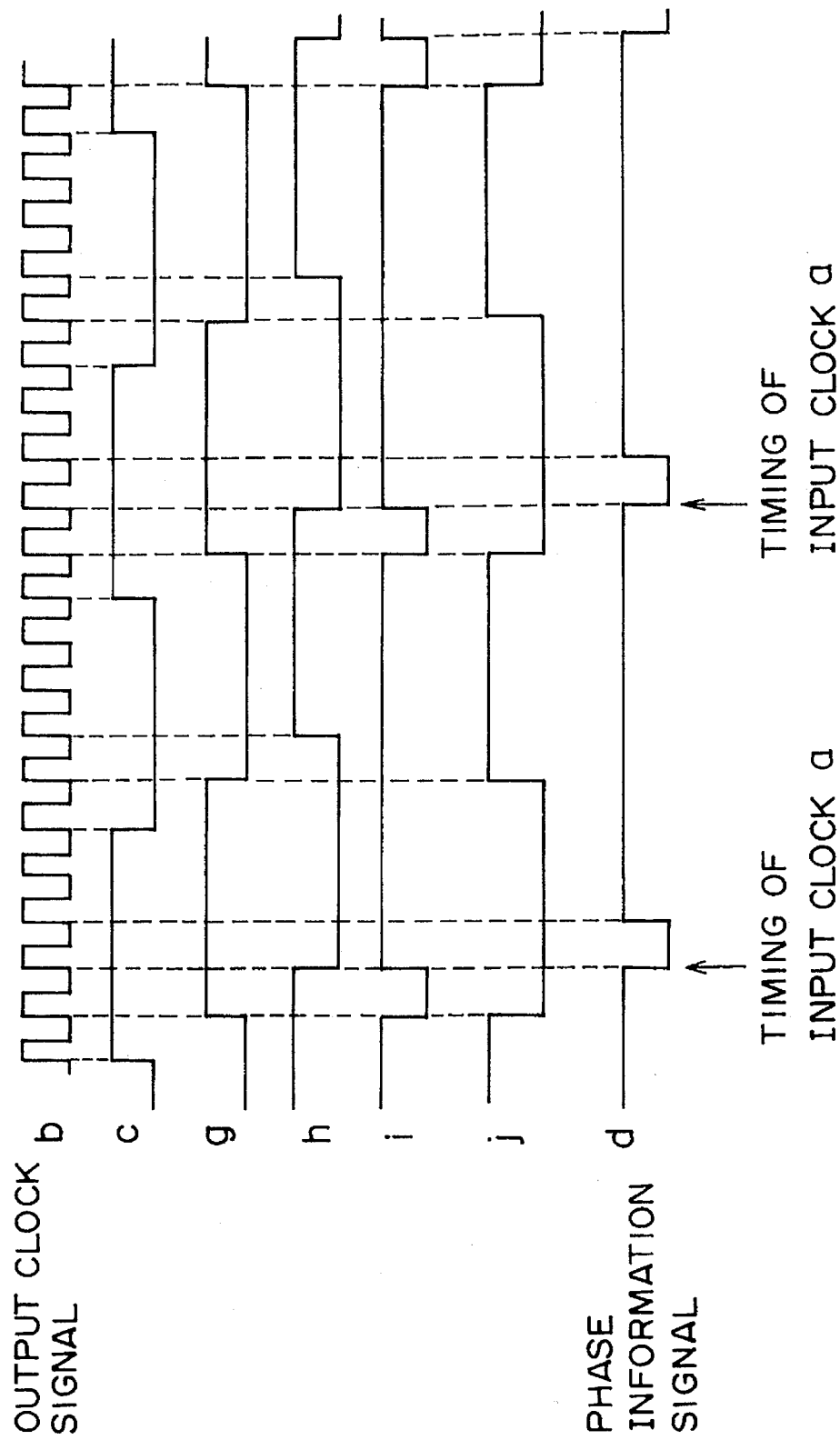

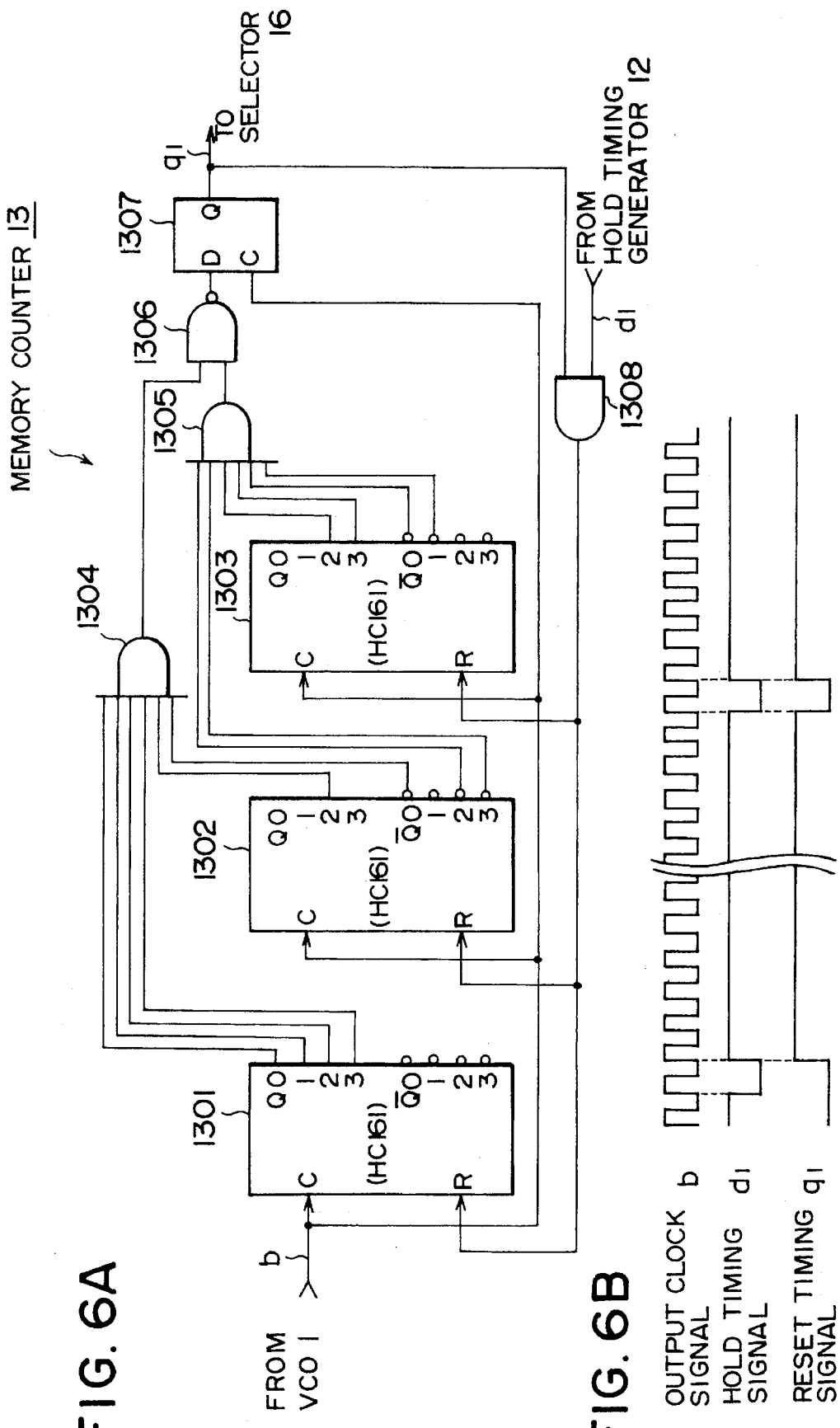

PHASE-LOCKED LOOP CIRCUIT HAVING A TIMING HOLDOVER FUNCTION

BACKGROUND OF THE INVENTION

1. Field of the invention

The present invention relates generally to a PLL (Phase-Locked Loop) circuit, more particularly, is directed to a PLL circuit which is capable of keeping a phase lock state of PLL even if some failure occurs in an input clock signal.

2. Prior Art

PLL circuits are employed in a variety of data communication devices in order to synchronize an internal clock to a particular clock signal receive from outside. Especially, since a data transmission system requires high reliability, it is necessary for the PLL circuit to maintain the phase lock state even if some failure occurs on incoming lines or the receiving clock signal is extremely deteriorated. For this reason, in most cases, a timing holdover function is provided with the PLL circuit.

FIG. 1 shows one example of a conventional PLL circuit having a timing holdover circuit. Referring to the figure, an output clock signal (b) which a voltage controlled oscillator (VCO) 1 generates is divided through a loop counter 2 to output it to a phase comparator 3. The phase comparator 3 compares the phases of an input clock signal (a) and the output clock signal (b) to output a voltage representing the phase difference to an amplifier 5 through a low pass filter 4. An output voltage of the amplifier 5 is applied to the VCO 1 as a control voltage. The input clock signal (a) is divided by a divider 6 and the output signal of the divider 6 is transferred to the phase comparator 3 through a selector 7.

The timing holdover circuit is formed as follows. A hold timing generator 8 receives a divided clock signal (c) from a divider (or a frequency demultiplier) 6 and outputs a reset timing signal (d) to a hold counter 10 through a switch 9, the reset timing signal (d) indicating phase information of the input clock signal (a). The hold counter 10 is a dividing counter which divides the output clock signal (b) of the VCO 1 by a predetermined number, and is reset by the reset timing signal (d). A dividing ratio of the hold counter 10 is set at the same figure as the loop counter 2. The divided clock signal (f) is output to the selector 7. The selector 7 selects one of the divided clock signal (f) received from the hold counter 10 and the divided clock signal received from the divider 6 according to a fault detection signal (e) and outputs it to the phase comparator 3.

In case of a normal state, the selector 7 selects the divided clock signal received from the divider 6 and the switch 9 is closed to supply the reset timing signal (d) to the hold counter 10. Since the input clock signal (a) is selected, the output clock signal (b) is phase-locked to the input clock signal (a). Moreover, every time receiving the reset timing signal (d) which indicates the phase information of the input clock signal (a), the hold counter 10 updates the clock phase stored therein.

If no input clock signal (a) is received or a large deviation of frequency or phase occurs, the fault detection signal (e) becomes active. When the fault detection signal (e) becomes active, the switch 9 is opened and the selector 7 selects the divided clock signal (f) to output it to the phase comparator 3. The hold counter 10 outputs the divided clock signal (f) corresponding to the reset timing signal (d) which was received just before the fault occurrence. Therefore, the VCO 1 generates the output clock signal (b) on the basis of the divided clock signal (f). In other words, even though any fault occurs on the input clock signal (a), a lock state of PLL can be maintained. However, the conventional PLL circuit mentioned above retains the PLL lock state by using the phase information just before the failure occurs. Therefore, if the input clock signal (a) was deteriorated by the time when the failure occurs, the PLL circuit is locked according to the phase information of a deteriorating input clock.

SUMMARY OF THE INVENTION

An object of the present invention is to provide a PLL circuit and a timing holdover method which are capable of generating an accurate clock signal even when the input clock signal stops dead by some failure.

Another object of the present invention is to provide a PLL circuit and a timing holdover method which are capable of obtaining an accurate clock signal even though the input clock signal has been deteriorated by the time of failure occurrence.

According to the present invention, a PLL circuit detects a plurality of phase components from an input signal at different time instants having a predetermined time interval, and selects one of the phase components as a timing holdover signal except a phase component detected at a latest time interval.

The PLL circuit is comprised of circuit elements as follows. An oscillator generates an oscillation signal according to a control signal. A time constant generator generates a signal which has a period of a time interval T. A phase detector detects a predetermined number of phase components from an input signal at consecutive time instants having the time interval T, respectively. Further, the phase-locked loop circuit is provided with dividing counters for generating first signals in accordance with the phase component signals, respectively. Of the first signals, except a first signal having a phase component signal detected at a latest time instant, a single first signal is selected. Furthermore, either the single first signal or the input signal is selected as a reference signal in accordance with a failure detection signal received from outside the phase-locked loop circuit. In other words, the input signal is selected when no failure occurs on an input clock line. On the contrary, the first signal is selected when some failure occurs. A phase comparator detects a phase difference between the oscillation signal and the reference signal to generate the control signal corresponding to the phase difference, and the control signal is output to the oscillator.

From another aspect of the present invention, the phase-locked loop circuit is comprised of a plurality of memory counters which generate respective timing clocks corresponding to phase components detected from an input clock signal at different time instants having a predetermined time interval. Of the timing clocks, a single timing clock is selected such that the timing clock selected corresponds to a phase component previous to the latest phase component of the input clock signal. When the input clock signal stops dead or a substantial departure of frequency or phase occurs therein, the timing clock selected is applied as a reference clock to a phase comparator of the PLL circuit instead of the input clock signal.

BRIEF DESCRIPTION OF THE DRAWINGS

FIG. 5A is a timing chart partially showing an operation of the hold timing generator of FIG. 4;

FIG. 6A is a more detailed circuit diagram of a memory counter in the embodiment of FIG. 2;

FIG. 6B is a timing chart showing an operation of the memory counter of FIG. 6A;

DETAILED DESCRIPTION OF THE PREFERRED EMBODIMENT

Figure 1:
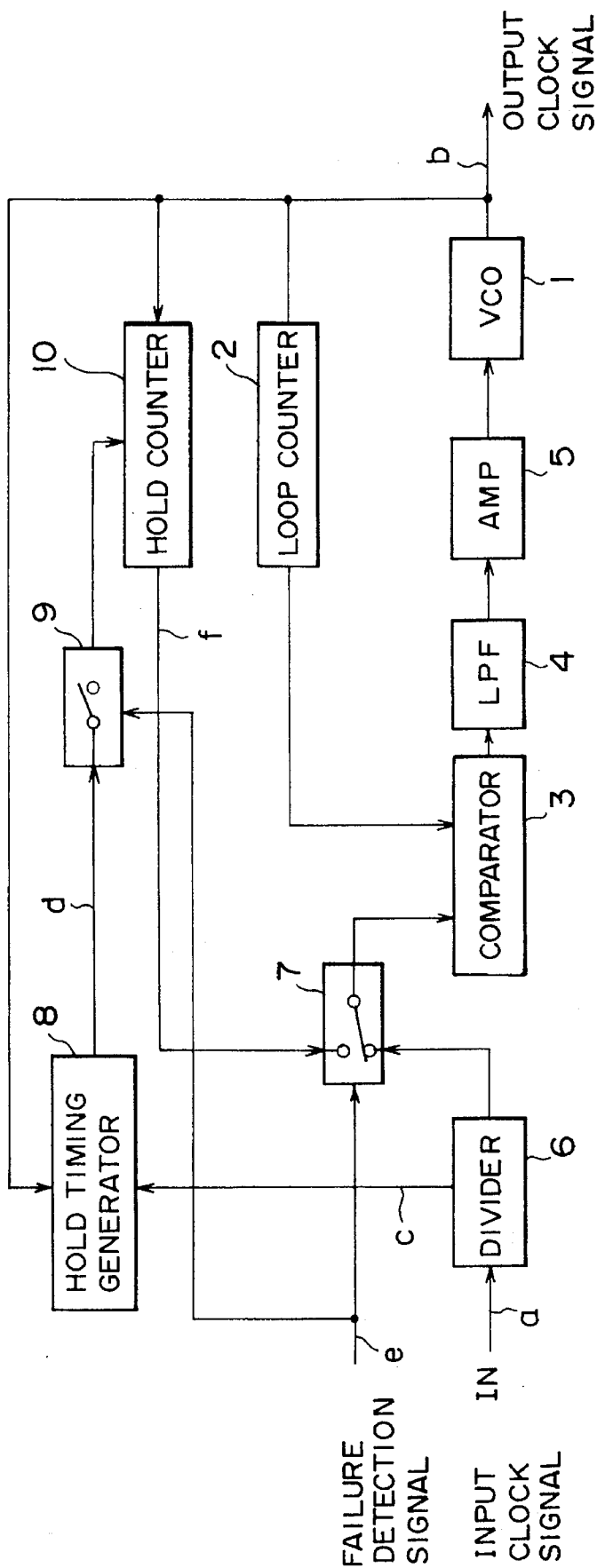
FIG. 1 is a block diagram which shows one example of a conventional PLL circuit.
Figure 2:
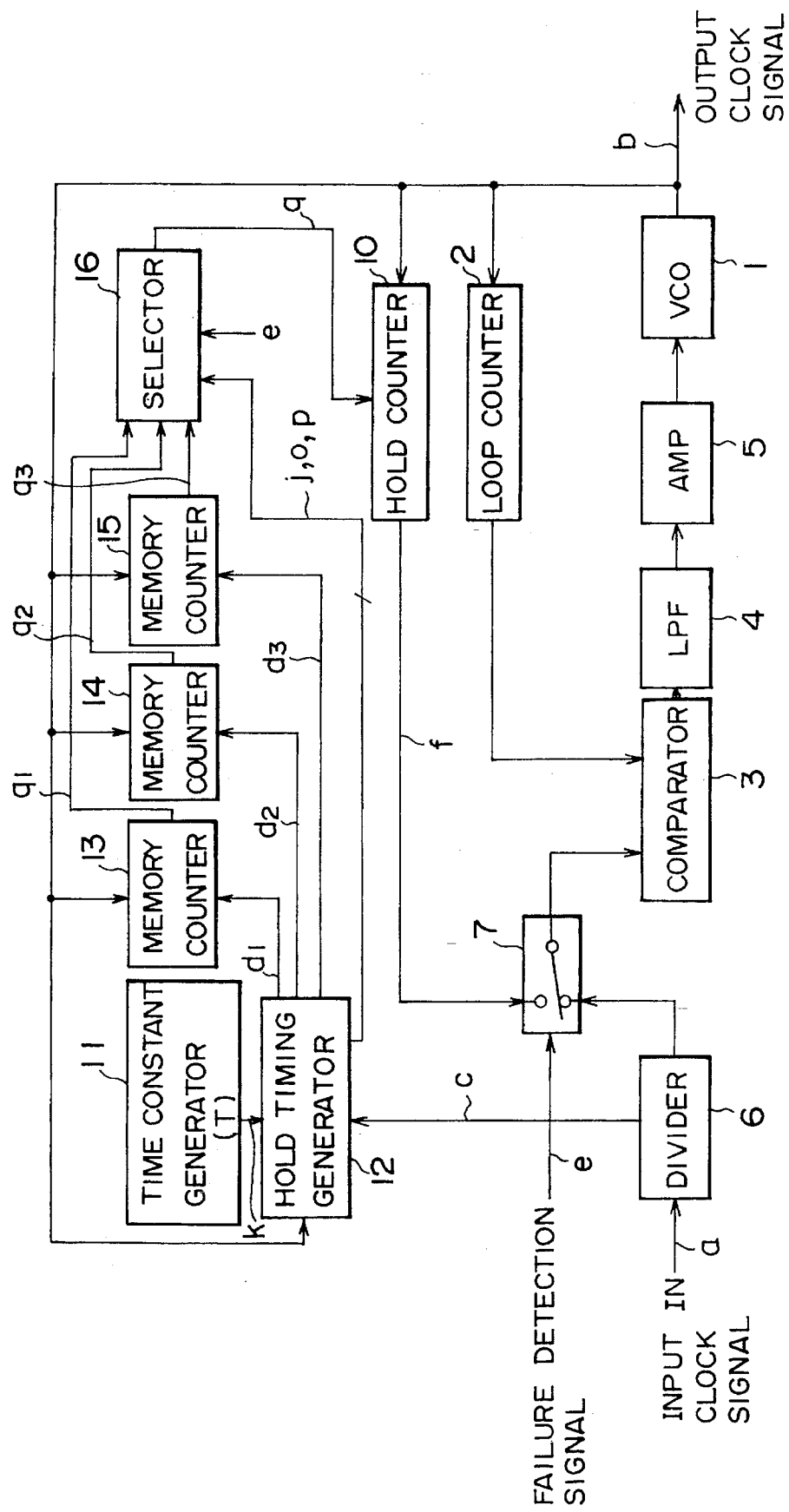
FIG. 2 is a block diagram which shows an embodiment of a PLL circuit according to the present invention.

In FIG. 2, circuit elements similar to those previously described with reference to FIG. 1 are denoted by the same reference numerals.

Referring to FIG. 2, a PLL circuit according to the present invention is comprised of a PLL loop circuit and a timing holdover circuit. The PLL loop circuit is similar to the arrangement of FIG. 1. More specifically, the output clock signal (b) generated by the VCO 1 is divided through the loop counter 2 and the divided clock signal is output to the phase comparator 3. Comparing the phases of the input clock signal (a) and the output clock signal (b), the phase comparator 3 outputs a voltage corresponding to the phase difference to the amplifier 5 through the low pass filter 4. An output voltage of the amplifier 5 is applied to the VCO 1 as a control voltage. The input clock signal (a) is frequency-divided by the divider 6 and the output signal of the divider 6 is transferred to the phase comparator 3 through the selector 7. The selector 7 selects the input clock signal (a) when the fault detection signal (e) is non-active or idle, and selects the output of the hold counter 10 when the fault detection signal (e) is active.

In the timing holdover circuit of the embodiment, the hold counter 10 is a dividing counter of the output clock signal (b) and is also a memory counter which is capable of continuing to output the divided clock signal (f) whose phase is defined by a reset timing signal (q).

The divided clock signal (f) generated by the hold counter 10 is output to the selector 7. The selector 7 selects one of the divided clock signal (f) received from the hold counter 10 and the divided clock signal received from the divider 6 in accordance with the fault detection signal (e). The selected clock signal is transferred to the phase comparator 3. A time constant generator 11 generates a time constant signal (k) having a period of T to output it to a hold timing generator 12. Based on the output clock signal (b) and the time constant signal (k), the hold timing generator 12 sequentially extracts phase information from the divided clock signal (c) of the input clock signal (a) at different time instants. More specifically, the hold timing generator 12 generates three hold timing signals $d_1$, $d_2$ and $d_3$ which indicate phase information (timing) of the input clock signal (a) at three different time instants having a time interval T of the time constant signal k, respectively. These hold timing signals $d_1$, $d_2$ and $d_3$ are output to the memory counters 13, 14 and 15. In addition, the hold timing generator 12 outputs pulse signals (j), (o) and (p) to the selector 16.

The memory counters 13–15 each are comprised of a dividing counter similar to the hold counter 10. The hold timing signals $d_1$, $d_2$ and $d_3$ causes the memory counters 13–15 to be reset, respectively. Therefore, the memory counters 13–15 are capable of generating reset timing signals $q_1$, $q_2$ and $q_3$ having the phases corresponding to the time instants of the hold timing signals $d_1$, $d_2$ and $d_3$, respectively. In other words, the memory counters 13–15 store phase components at respective time instants according to the hold timing signals $d_1$, $d_2$ and $_3$. The reset timing signals $q_1$, $q_2$ and $q_3$ are output to the selector 16. The selector 16 selects one of the reset timing signals $q_1$, $q_2$ and $q_3$ based on the pulse signals (j), (o) and (p), and outputs a selected reset timing signal (q) to the hold counter 10.

Time constant generator 11

The time constant signal (k) generated by the time constant generator 11 is a pulse signal having a predetermined period of T and a duty ratio of 50%. The period T is set to be longer than a time interval required for detection of deterioration or failure of the input clock signal (a). For example, the time constant generator 11 may be comprised of a multivibrator or flip flop circuits. Hold counter 10

Figure 3A:
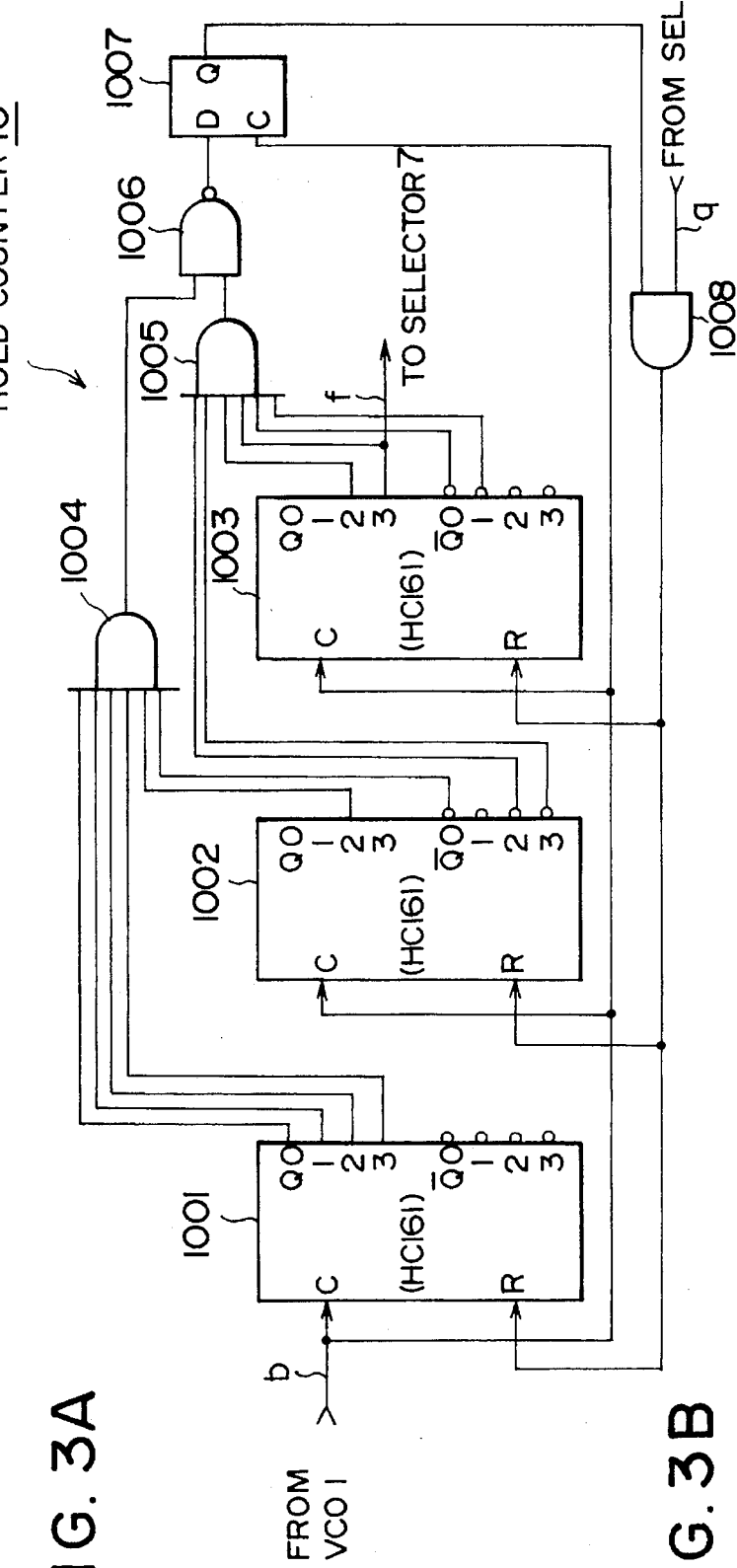
FIG. 3A is a more detailed circuit diagram of a hold counter in the embodiment of FIG. 2.

As shown in FIG. 3A, the hold counter 10 is comprised of three binary counters 1001–1003 each performing a count operation following the output clock signal (b) received from the VCO 1.

The output signals of the binary counters 1001–1003 are input to AND gate 1004 or AND gate 1005 according to predetermined connections.

The output signals of the AND gates 1004 and 1005 are input to NAND gate 1006, and the output signal of the NAND gate 1006 is input to AND gate 1008 through a D-type flip flop (DFF) 1007. Receiving the reset timing signal (q) and the output signal of the DFF 1007, the AND gate 1008 outputs a reset signal to each binary counter. The divided clock signal (f) is output from the output terminal Qo3 of the binary counter 1003 to the selector 7.

The dividing ratio of the hold counter 10 is selectable arbitrarily by connection between the AND gates 1004, 1005 and the binary counters 1001–1003. As for a dividing ratio, the hold counter 10 is set up equally with the loop counter 2. Assuming that a frequency of the output clock signal (b) is 12.96 MHz and a phase comparison frequency of the phase comparator 3 is 8 KHz, the dividing ratio set in the loop counter 2 and the hold counter 10 is 1/1620.

Figure 3B:
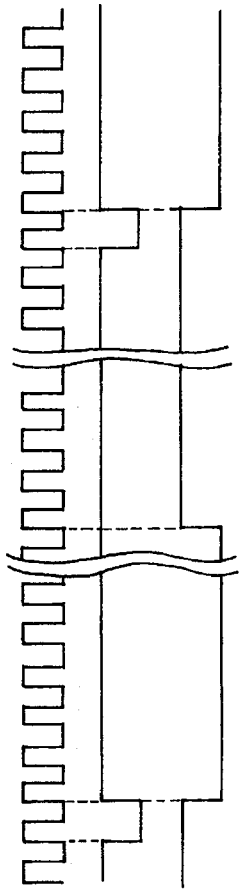
FIG. 3B is a timing chart to explain an operation of the hold counter of FIG. 3A.

As illustrated in FIG. 3B, the binary counters 1001–1003 are reset by the reset timing signal (q) and a count operation is performed according to the output clock signal (b). And, when each binary counter reaches a predetermined count value, the output Q of the DFF 1007 turns out to be a low level which causes the binary counters 1001–1003 to be reset. Therefore, the hold counter 10 may continue to generate the divided clock signal (f) comprising a series of pulses synchronizing with the reset timing signal (q). This means that the hold counter 10 stores the phase information of the reset timing signal (q).

Hold timing generator 12

Figure 4:
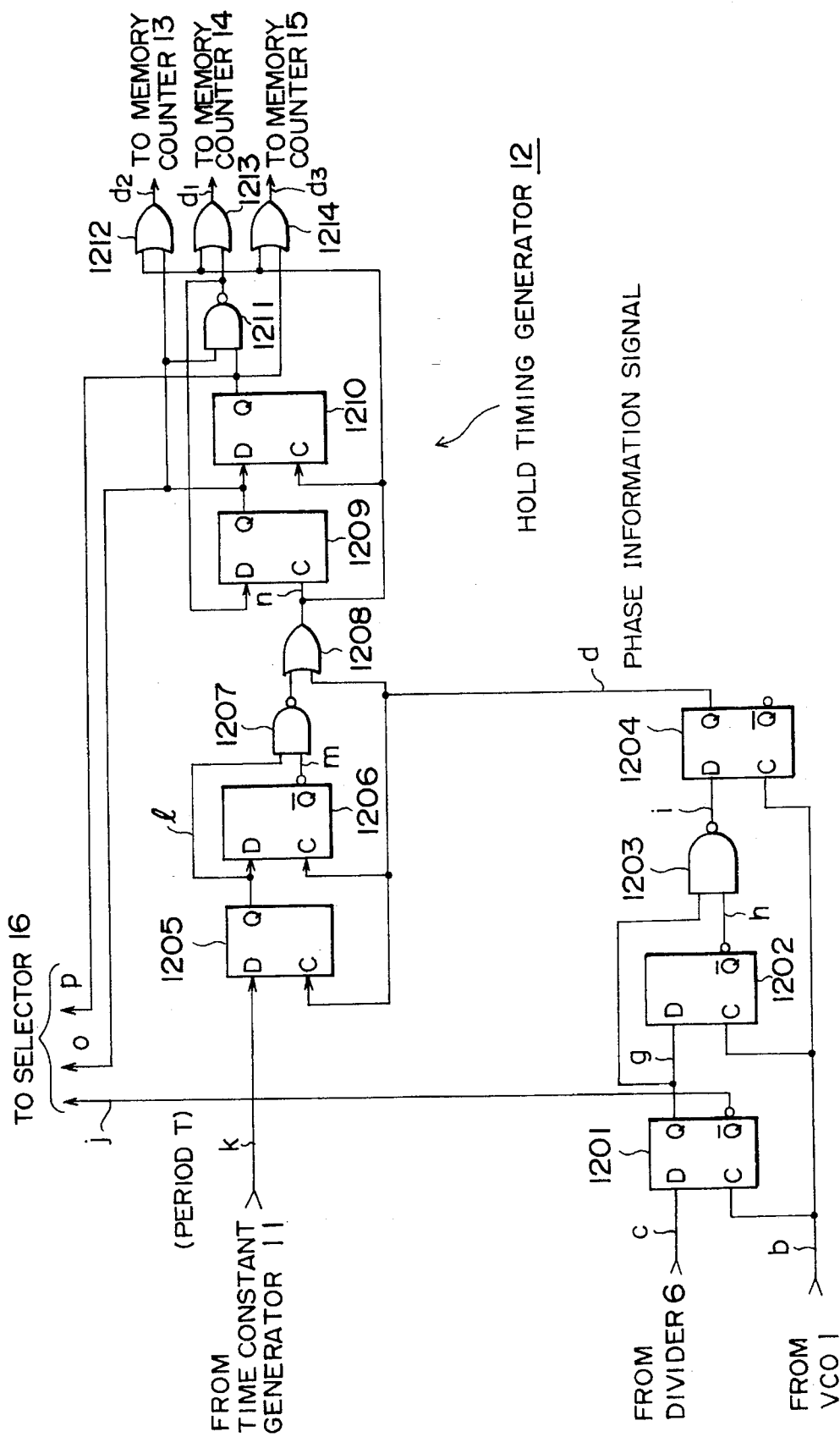
FIG. 4 is a more detailed circuit diagram of a hold timing generator in the embodiment of FIG. 2.

As shown in FIG. 4, the hold timing generator 12 uses the output clock signal (b) of the VCO 1 as a clock to generate the hold timing signals (or phase information signals) $d_1$, $d_2$ and $d_3$ having a time interval of T. As described before, the hold timing signals $d_1$, $d_2$ and $d_3$ are the phase components which are detected from the divided clock signal (c) of the input clock signal (a) at different time instants, respectively. More specifically, the DFFs 1201, 1202 and 1204 input the output clock signal (b) as a clock. When receiving the divided clock signal (c) from the divider 6, the DFF 1201 outputs a signal (g) to the DFF 1202 and at the same time outputs a inverted output signal (j) to the selector 16. A NAND gate 1203 inputs the output signal (g) of the DFF 1201 and an inverted output signal (h) of the DFF 1202 and outputs a signal (i) to the DFF 1204.

An output signal (d) of the DFF 1204 is used as a clock of the DFFs 1205 and 1206. The DFF 1205 inputs the time constant signal (k) having a period T from the time constant generator 11 and outputs a signal (l) to the DFF 1206 and a NAND gate 1207. The NAND gate 1207 performs a NAND function on the signal (l) and the output signal (m) of the DFF 1206 to output a signal (n). The signal (n) is used as a clock of the DFFs 1209 and 1210, and further is output to DFFs 1209, 1210 and OR-gates 1212–1214. The output signal (o) of the DFF 1209 is output to the DFF 1210, a NAND gate 1211, the OR gate 1212 and the selector 16. Moreover, the output signal (p) of the DFF 1210 is output to the NAND gate 1211, the OR gate 1214 and the selector 16. The output signal of the NAND gate 1211 is output to the OR gate 1213 and the DFF 1209.

Referring to FIG. 5A, receiving the divided clock signal (c) of the input clock signal (a), the DFF 1201 outputs the signal (g) to the DFF 1202 and the inverted signal (j) to the selector 16. The DFF 1202 delays the signal (g) by one clock of the output clock signal (b) and outputs the inverted signal (h) to the NAND gate 1203. The NAND gate 1203 outputs the signal (i) to the DFF 1204 where the signal (i) is delayed by one clock. This causes the DFF 1204 to output the signal (d) representing the divided clock signal (c). In other words, the signal (d) is a pulse signal which indicates the phase information of the input clock signal (a).

Figure 5B:
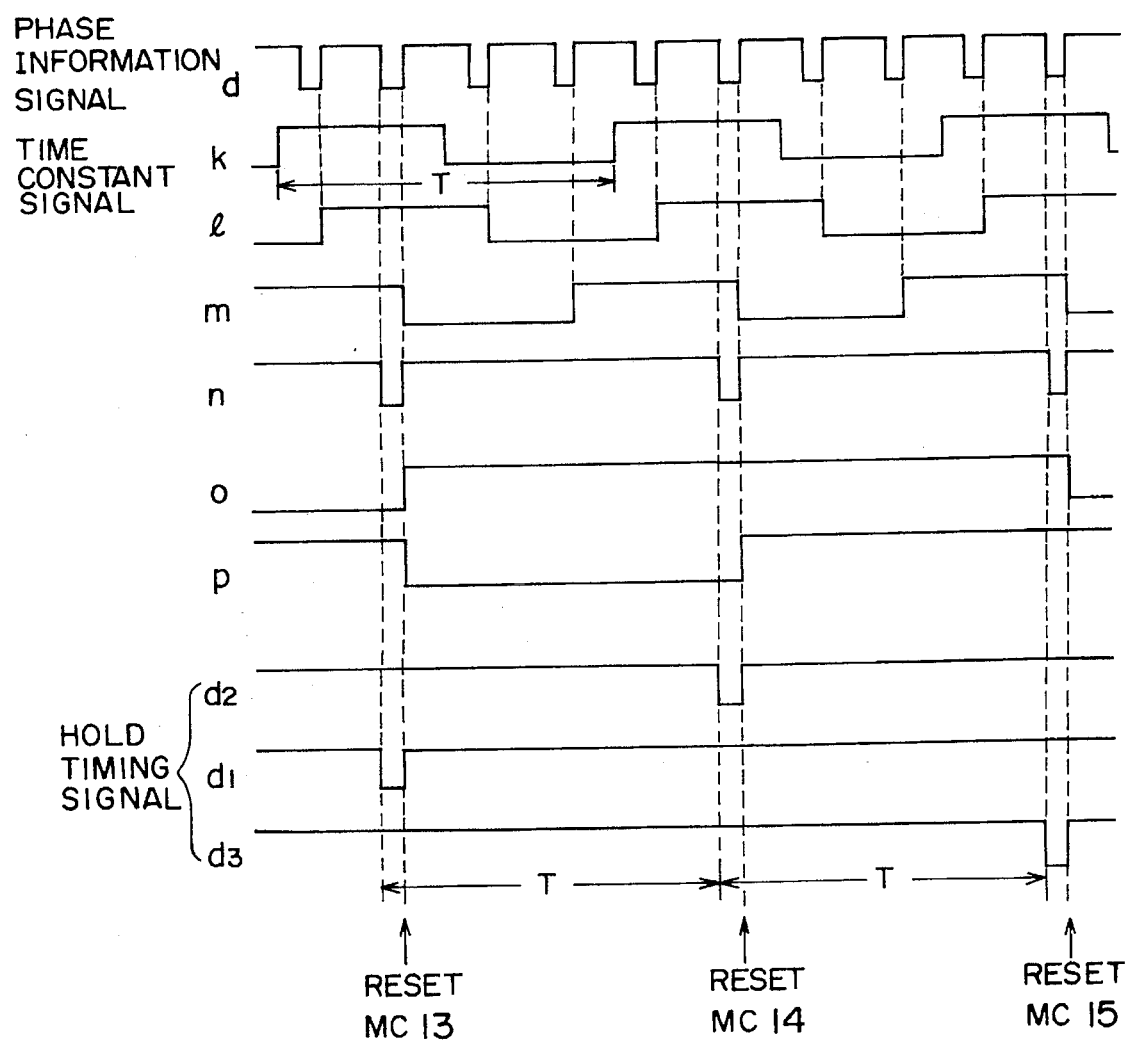
FIG. 5B is a timing chart partially showing the operation of the hold timing generator.

As shown in FIG. 5B, such a phase information signal (d) is thinned into a phase information signal (n) in accordance with the period T of the time constant signal k. The phase information signal (n) having a period of T is output from the OR gate 1208 to the DFFs 1209 and 1210 as a clock. The phase information signal (n) is divided into three hold timing signals $d_1$, $d_2$ and $d_3$ each having a time interval of T, which are output to the memory counters 13–15, respectively.

Memory counters 13–15

The memory counters 13-15 are identical and each circuit is similar to the hold counter 10. Hereinafter, the circuit of the memory counter 13, as an example, is explained.

As shown in FIG. 6A, the memory counter 13 is comprised of three binary counters 1301–1303 each performing a count operation following the output clock signal (b) received from the VCO 1.

The output signals of the binary counters 1301–1303 are input to AND gate 1304 or AND gate 1305 according to predetermined connections.

The output signals of the AND gates 1304 and 1305 are input to NAND gate 1306, and the output signal of the NAND gate 1306 turns out to be the reset timing signal $q_1$ through a DFF 1307. Receiving the hold timing signal $d_1$ and the reset timing signal $q_1$, the AND gate 1308 outputs a reset signal to each binary counter. The reset timing signal $q_1$ is also output from the DFF 1307 to the selector 16. The dividing ratio of the memory counter 13 is selectable arbitrarily by connection between the AND gates 1304, 1305 and the binary counters 1301–1303.

As illustrated in FIG. 6B, the binary counters 1301–1303 are reset by the hold timing signal $d_1$ and a count operation is performed according to the output clock signal (b). And, when each binary counter reaches a predetermined count value, the output Q, that is, the reset timing signal $q_1$ of the DFF 1307 falls to a low level which causes the binary counters 1301–1303 to be reset. Therefore, the memory counter 13 may continue to generate the reset timing signal $q_1$ comprising a series of pulses synchronizing with the hold timing signal $d_1$. In other words, every time receiving the hold timing signal $d_1$ from the hold timing generator 12, the memory counter 13 stores the phase information of the hold timing signal $d_1$. As a result, even when some failure causes the input clock signal (a) to stop dead, the reset timing signal $q_1$ may continue to be generated according to the phase information stored just before the failure occurs.

Other memory counters 14 and 15 also works similarly. The memory counter 14 stores phase information of the hold timing signal $d_2$ and generates the reset timing signal $q_2$ synchronizing with it. The memory counter 15 stores phase information of the hold timing signal $d_3$ and generates the reset timing signal $q_3$ synchronizing with it.

Selector 16

Figure 7:
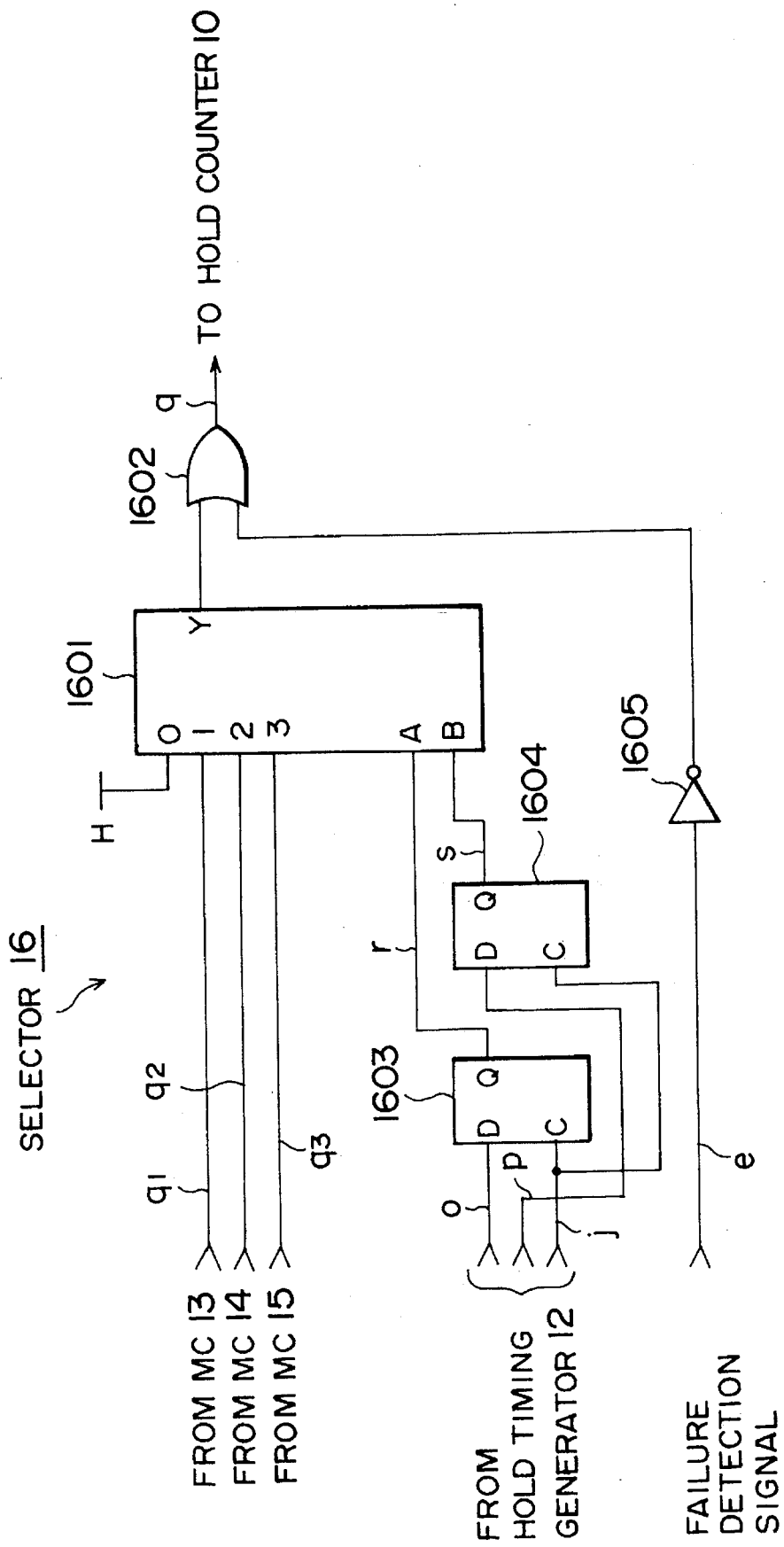
FIG. 7 is a more detailed circuit diagram of a selector in the embodiment of FIG. 2.

As shown in FIG. 7, the selector 16 receives the reset timing signals $q_1$, $q_2$ and $q_3$ from the memory counters 13–15, respectively, and selects one of the reset timing signals $q_1$, $q_2$ and $q_3$ according to selection control signal (r, s) of 2 bits. A selecting circuit 1601 has four input ports, three input ports of which receive the reset timing signals $q_1$, $q_2$ and $q_3$, respectively. The remaining input port is fixed at a high level. An output Y of the selecting circuit 1601 is output to the hold counter 10 as the reset timing signal q through an OR gate 1602.

The selection control signal (r, s) is generated by DFFs 1603 and 1604 receding the signals (j), (o) and (p) from the hold timing generator 12. The signal (j) is fed as a clock to the DFFs 1603 and 1604, the signal (o) is input to the DFF 1603, and the signal (p) is input to the DFF 1604. Therefore, it is determined which reset timing signal is selected depending on mutual timing of the signals (j), (o) and (p).

The failure detection signal (e) is output to the OR gate 1602 through an inverter 1605. Therefore, when the failure detection signal (e) becomes active, the reset timing signal (q) which is selected by the selecting circuit 1601 is output to the hold counter 10 through the OR gate 1602.

Figure 8:
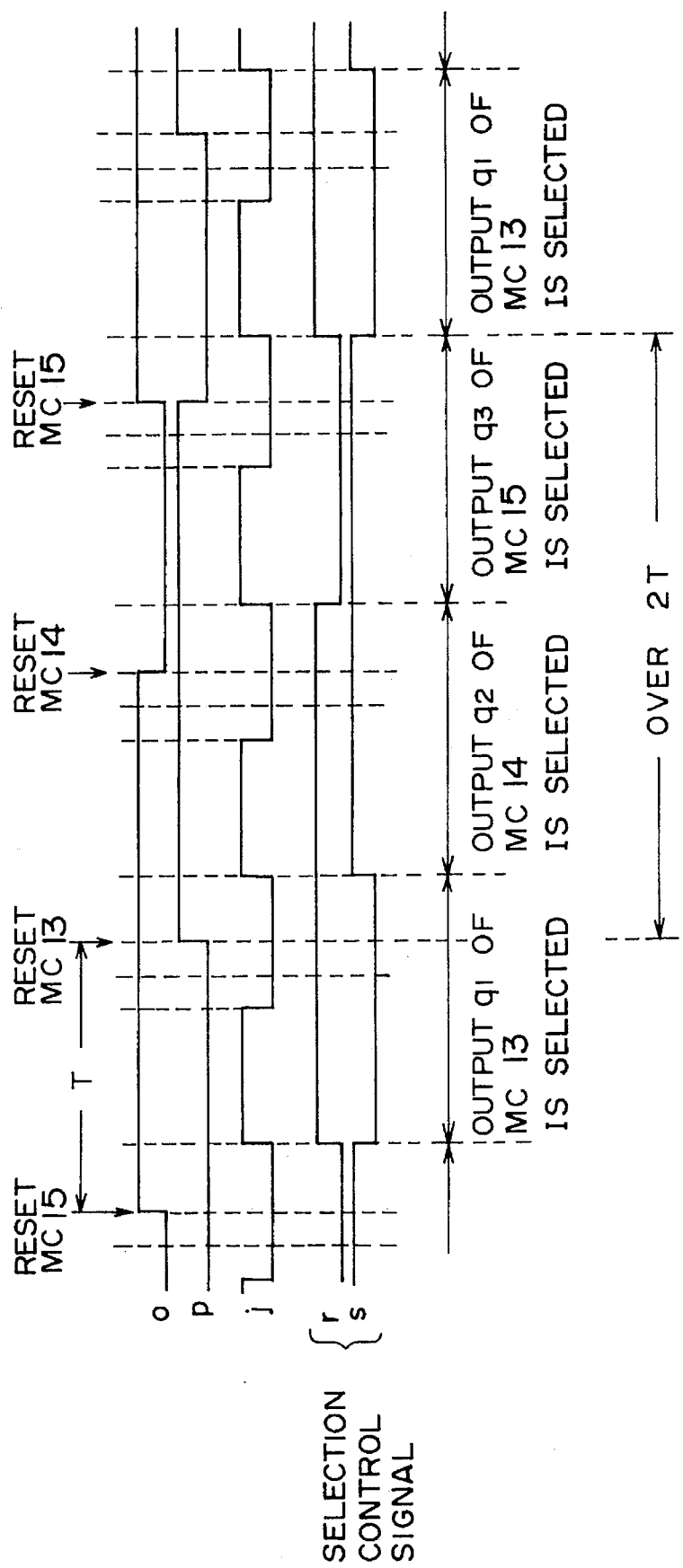
FIG. 8 is a timing chart showing an operation of the selector of FIG. 7.

Referring to FIG. 8, using the signals (j), (o) and (p) generated by the hold timing generator 12, the selection control signal (r, s) is decided so as to avoid reset/selection contention for the memory counters 13–15. In this embodiment, the selection control signal (r, s) changes in synchronization with the leading edge of the signal (j). As shown in the same figure, the selecting circuit 1601 selects the reset timing signal $q_1$ of the memory counter 13 at the time when (r, s)=(1, 0), the reset timing signal $q_2$ of the memory counter 14 at the time when (r, s)=(1, 1), and the reset timing signal $q_3$ of the memory counter 15 at the time when (r, s)=(0, 1).

By performing reset and selection of the memory counters 13–15 in this way, the reset timing signal q always represents the phase information of the input clock signal (a) at a time instant 2T or more previous to the present time instant. For example, considering that the reset timing signal $q_1$ stored in the memory counter 13 is selected when (r, s)=(1, 0), the reset timing signal $q_1$ indicates the phase information of the input clock signal (a) more than 2T before the present time instant. Therefore, even when the input clock signal (a) was deteriorating and subsequently some failure occurred, the hold counter 10 is capable of receiving the reset timing signal q which indicates the phase information before the input clock signal (a) began deteriorating in quality. The time interval T may be set by the time constant generator 11.

Operation

A whole operation of the PLL circuit as shown in FIG. 2 will be explained hereinafter.

When the failure detection signal (e) is idle, the selector 7 selects the output of the divider 6. The divided clock signal of the input clock signal (a) is output to the phase comparator 3 through the selector 7. Therefore, the well-known PLL operation is performed and the VCO 1 generates the output clock signal (b) which is phase-locked to the input clock signal (a).

Paralleling the PLL operation, the hold timing generator 12 detects the phase components of the input clock signal (a) in a cycle of the time interval T and generates the hold timing signals $d_1$, $d_2$ and $d_3$ having the phase components at different time instants, respectively. The respective hold timing signals $d_1$, $d_2$ and $d_3$ are output to the memory counters 13–15. The memory counters 13–15 are reset in timing of the respective hold timing signals and stores the phase information of the input clock signal (a) at the respective time instants. In other words, the memory counters 13–15 generates the reset timing signal $q_1$, $q_2$ and $q_3$ each representing a phase component at a different time instant. Of these reset timing signals, the selector 16 selects a reset timing signal q which corresponds to a time instant 2T before the current time instant.

In such usual PLL operation, assume that the failure detection signal (e) becomes active. This causes the selector 7 to select the hold counter 10 and the selector 16 to output the reset timing signal q to the hold counter 10. The hold counter 10 divides the output clock signal (b) according to the timing of the receiving reset timing signal (q) and outputs the divided clock signal (f) to the phase comparator 3 through the selector 7. Since the reset timing signal q indicates the phase information of the input clock signal (a) 2T or more earlier, even though quality deterioration of the input clock signal (a) has occurred by that time, the divided clock signal (f) reflects the accurate phase of the input clock signal (a). Therefore, if some failure occurs, the VCO 1 is capable of generating the output clock signal (b) matching the accurate phase before the input clock signal (a) begins deteriorating in quality.

Although the above-mentioned embodiment employs three memory counters 13–15, the present invention is not restricted to this embodiment. It is apparent from the present embodiment that a plurality of memory counters may be employed as necessary so that reset/selection contention for these memory counters does not develop.

What is claimed is:

1. A phase-locked loop circuit comprising:

an oscillator for generating an oscillation signal of a frequency varying based on a control signal;

time interval setting means for generating a periodic signal having a period equal to a time interval T;

detecting means for detecting a predetermined number of phase components from an input signal at consecutive time instants having the time interval T, respectively;

first selecting means for selecting a signal phase component from the phase components excluding a phase component detected at a latest time instant;

generating means for generating a first signal in accordance with the single phase component;

second selecting means for selecting a reference signal from the first signal and the input signal in accordance with a second signal received from outside the phase-locked loop circuit; and means for detecting a phase difference between the oscillation signal and the reference signal to generate the control signal corresponding to the phase difference.

2. The phase-locked loop circuit according to claim 1, wherein the detecting means comprises:

phase extracting means for sequentially extracting the phase components from the input signal; and the predetermined number of memory means for storing the phase components, respectively.

3. The phase-locked loop circuit according to claim 2, wherein each the memory means comprises:

a divider for dividing the oscillation signal by a predetermined value to generate a divided signal; and a logical gate for generating a reset signal based on the divided signal and a phase component, the reset signal outputting to the divider when at least one of the divided signal and the phase component becomes logically active.

4. The phase-locked loop circuit according to claim 1, wherein the generating means comprises predetermined number of memory means for storing the single phase component, each the memory means comprises:

a divider for dividing the oscillation signal by a predetermined value to generate a divided signal; and a logical gate for generating a reset signal based on the divided signal and the signal phase component, the reset signal output to the divider when at least one of the divided signal and the single phase component becomes logically active.

5. The phase-locked loop circuit according to claim 1, wherein the second selecting means selects the first signal when the second signal is in one state, and selects the input signal when the second signal is in the other state.

6. The phase-locked loop circuit according to claim 1, wherein the second signal is a failure detection signal of the input signal.

7. A phase-locked loop circuit comprising:

an oscillator for generating an oscillation signal of a frequency varying based on a control signal;

time interval setting means for setting a time interval by generating a periodic signal having a period equal to the time interval;

detecting means for detecting a predetermined number of phase components from an input signal at consecutive time instants having the time interval, respectively;

phase memory means for generating first signals having the phase components, respectively;

first selecting means for selecting a single first signal from the first signals such that the phase component of the single first signal is detected by the detecting means at a time instant previous to a last one of the consecutive time instants;

generating means for generating a second signal synchronizing with the single first signal;

second selecting means for selecting a reference signal from the second signal and the input signal in accordance with a third signal received from outside the phase-locked loop circuit; and means for detecting a phase difference between the oscillation signal and the reference signal to generate the control signal corresponding to the phase difference.

8. The phase-locked loop circuit according to claim 7, wherein the phase memory means comprises the predetermined number of memory counters for storing the phase components, respectively.

9. The phase-locked loop circuit according to claim 8, wherein each the memory means comprises:

a divider for dividing the oscillation signal by a predetermined value to generate a divided signal; and a logical gate for generating a reset signal based on the divided signal and a phase component, the reset signal output to the divider when at least one of the divided signal and the phase component signal becomes logically active.

10. A phase-locked loop circuit comprising:

an oscillator for generating an output clock signal of a frequency varying based on a control signal;

a first divider for dividing an input clock signal by a predetermined value to generate a divided input clock signal;

a second divider for dividing the oscillation clock signal by a predetermined value to generate a divided output clock signal;

a time constant generator for setting a time interval by generating a periodic signal which has a cycle of the time interval;

a phase detector for detecting a predetermined number of phase components from the divided input clock signal at consecutive time instants having the time interval, respectively;

the predetermined number of memory counters for generating first signals having the phase components, respectively;

a first selector for selecting a single first signal from the first signals such that the phase component of the single first signal is detected by the detecting means at a time instant previous to a last one of the consecutive time instants;

a clock generator for generating a second signal synchronizing with the single first signal;

a second selector for selecting a reference signal from the second signal and the divided input signal in accordance with a failure detection signal of the input clock signal; and a phase comparator for detecting a phase difference between the divided output clock signal and the reference signal to generate the control signal corresponding to the phase difference.

11. A timing holdover method in a phase-locked loop circuit, comprising the steps of:

generating an oscillation signal of a frequency varying based on a control signal;

setting a time interval by generating a priodic signal which has a cycle of the time interval;

detecting a predetermined number of phase components from an input signal at consecutive time instants having the time interval, respectively;

selecting a single phase component from the phase components except a phase component signal detected at a latest time instant;

generating a first signal in accordance with the single phase component;

selecting a reference signal from the first signal and the input signal in accordance with a second signal received from outside the phase-locked loop circuit; and detecting a phase difference between the oscillation signal and the reference signal to generate the control signal corresponding to the phase difference.

12. The method according to claim 11, wherein the step of selecting the reference signal comprises:

selecting the first signal when the second signal is in one state; and selecting the input signal when the second signal is in the other state.

13. The method according to claim 11, wherein the second signal is a failure detection signal of the input signal.

14. A timing holdover method in a phase-locked loop circuit, comprising the steps of:

generating an oscillation signal of a frequency varying based on a control signal;

setting a time interval by generating a periodic signal which has a cycle of the time interval;

detecting a predetermined number of phase components from an input signal at consecutive time instants having the time interval, respectively;

generating first signals having the phase components, respectively;

selecting a single first signal from the first signals such that the phase component of the single first signal is detected at a time instant previous to a last one of the consecutive time instants;

generating a second signal synchronizing with the single first signal;

selecting a reference signal from the second signal and the input signal in accordance with a third signal received from outside the phase-locked loop circuit; and detecting a phase difference between the oscillation signal and the reference signal to generate the control signal corresponding to the phase difference.

15. The method according to claim 14, wherein the step of selecting the reference signal comprises:

selecting the second signal when the third signal is in one state; and selecting the input signal when the third signal is in the other state.

16. The method according to claim 14, wherein the third signal is a failure detection signal of the input signal.

17. A phase-locked loop circuit comprising:

a loop circuit receiving a reference clock signal and generating an output clock signal therefrom;

a timing holdover circuit receiving said output clock signal and generating a holdover reference signal corresponding to phase information gathered at a processing period at interval T preceding a current processing period and excluding phase component detected at the current processing period; and a selection circuit receiving an external reference signal and the holdover reference signal, said selection circuit sending the external reference signal to the loop circuit during normal operation, and sending the holdover reference signal to the loop circuit during period when the external reference signal is faulty.

* * * * *